(12) United States Patent
Tsai et al.

(10) Patent No.: US 10,343,897 B2
(45) Date of Patent: *Jul. 9, 2019

(54) INTEGRATED PACKAGE CONTAINING MEMS ACOUSTIC SENSOR AND ENVIRONMENTAL SENSOR AND METHODOLOGY FOR FABRICATING SAME

(71) Applicant: INVENSENSE, Inc., San Jose, CA (US)

(72) Inventors: Julius Ming-Lin Tsai, San Jose, CA (US); Baris Cagdaser, Sunnyvale, CA (US); Martin Lim, San Mateo, CA (US); Aleksey S. Khenkin, Nashua, NH (US)

(73) Assignee: INVENSENSE, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/468,066

(22) Filed: Mar. 23, 2017

(65) Prior Publication Data

US 2017/0190571 A1 Jul. 6, 2017

Related U.S. Application Data

(63) Continuation of application No. 14/273,845, filed on May 9, 2014, now Pat. No. 9,617,144.

(51) Int. Cl.
*B81B 7/02* (2006.01)
*B81C 1/00* (2006.01)
(Continued)

(52) U.S. Cl.
CPC .............. *B81B 7/02* (2013.01); *B81C 1/0023* (2013.01); *H04R 1/04* (2013.01); *H04R 29/004* (2013.01);
(Continued)

(58) Field of Classification Search
CPC .... H04R 19/04; H04R 19/005; H04R 19/016; H04R 1/025; H04R 1/04; H04R 3/005;
(Continued)

(56) References Cited

U.S. PATENT DOCUMENTS 8,049,287 B2 11/2011 Combi et al.
8,216,882 B2 7/2012 Lin et al.
(Continued)

FOREIGN PATENT DOCUMENTS

| CN | 103449353 A | 12/2013 |
|---|---|---|
| JP | 2005106802 A | 4/2005 |
| WO | 2013156539 | 10/2013 |

OTHER PUBLICATIONS

Chinese Office Action dated Jul. 18, 2017 for Chinese Application No. 201580024337.9, 14 pages.
(Continued)

*Primary Examiner* — Joshua Kaufman
(74) *Attorney, Agent, or Firm* — Amin, Turocy & Watson, LLP (57) ABSTRACT

An integrated package of at least one environmental sensor and at least one MEMS acoustic sensor is disclosed. The package contains a shared port that exposes both sensors to the environment, wherein the environmental sensor measures characteristics of the environment and the acoustic sensor measures sound waves. The port exposes the environmental sensor to an air flow and the acoustic sensor to sound waves. An example of the acoustic sensor is a microphone and an example of the environmental sensor is a humidity sensor.

17 Claims, 5 Drawing Sheets

(51) Int. Cl.
  *H04R 1/04* (2006.01)
  *H04R 29/00* (2006.01)
  *H04R 19/04* (2006.01)
(52) U.S. Cl.
  CPC ............... *B81B 2201/0214* (2013.01); *B81B 2201/0257* (2013.01); *B81B 2201/0264* (2013.01); *B81B 2201/0278* (2013.01); *B81B 2201/0292* (2013.01); *B81B 2207/012* (2013.01); *B81B 2207/07* (2013.01); *B81C 2203/0792* (2013.01); *H01L 2224/48091* (2013.01); *H01L 2224/48465* (2013.01); *H01L 2224/73265* (2013.01); *H01L 2924/16152* (2013.01); *H04R 19/04* (2013.01); *H04R 2201/003* (2013.01)
(58) Field of Classification Search
  CPC ... H04R 2201/003; B81B 7/00; B81B 7/0032; B81B 7/007; B81B 7/008; B81B 7/02; B81B 7/04; B81B 2201/00; B81B 2201/02–0292; B81B 2207/00; B81B 2207/01; B81B 2207/012; B81B 2207/015
  See application file for complete search history.

(56) References Cited

U.S. PATENT DOCUMENTS

| | | |
|---|---|---|
| 8,487,387 B2 | 7/2013 | Lin |
| 8,536,663 B1 | 9/2013 | Kuo |
| 8,618,619 B1 | 12/2013 | Miks |
| 8,625,832 B2 | 1/2014 | Lillelund |
| 8,692,340 B1 | 4/2014 | Ata et al. |
| 9,078,063 B2 | 7/2015 | Loeppert |
| 9,617,144 B2 * | 4/2017 | Tsai ................ B81B 7/02 |
| 2006/0001114 A1 | 1/2006 | Chen et al. |
| 2008/0315333 A1 * | 12/2008 | Combi ................ B81B 7/0061 257/415 |
| 2010/0242603 A1 | 9/2010 | Miller et al. |
| 2011/0126632 A1 | 6/2011 | McNeil et al. |
| 2011/0127623 A1 | 6/2011 | Fueldner et al. |
| 2011/0160609 A1 | 6/2011 | Stone |
| 2012/0212925 A1 | 8/2012 | Zoellin et al. |
| 2013/0001710 A1 | 1/2013 | Daneman et al. |
| 2013/0032905 A1 | 2/2013 | Lo et al. |
| 2013/0119492 A1 | 5/2013 | Feiertag et al. |
| 2013/0322675 A1 * | 12/2013 | Zoellin ................ H04R 1/04 381/355 |
| 2014/0044297 A1 | 2/2014 | Loeppert et al. |
| 2014/0103464 A1 | 4/2014 | Bolognia et al. |
| 2014/0112510 A1 | 4/2014 | Yang |
| 2014/0210019 A1 | 7/2014 | Nasiri et al. |
| 2014/0264651 A1 | 9/2014 | Dehe et al. |
| 2015/0001645 A1 | 1/2015 | Faralli |
| 2015/0003638 A1 | 1/2015 | Kasai |
| 2015/0082856 A1 | 3/2015 | Paci et al. |
| 2015/0102434 A1 | 4/2015 | Maggi et al. |
| 2015/0115377 A1 * | 4/2015 | DeNatale ........... G01C 19/5712 257/415 |
| 2015/0158722 A1 | 6/2015 | Lim et al. |
| 2015/0192416 A1 | 7/2015 | Nasiri et al. |

OTHER PUBLICATIONS

International Search Report and Written Opinion dated Aug. 13, 2015 for PCT Application Serial No. PCT/US2015/29969, 13 pages.
Office Action for U.S. Appl. No. 14/273,845 dated Sep. 9, 2015, 20 pages.
Office Action for U.S. Appl. No. 14/273,845 dated Jun. 21, 2016, 21 pages.
Notice of Allowance for U.S. Appl. No. 14/273,845 dated Dec. 2, 2016, 26 pages.
Office Action for U.S. Appl. No. 14/273,845 dated Feb. 18, 2016, 24 pages.
European Search Report dated Mar. 28, 2017 for European Application No. 15788858.7, 8 pages.
European Office Action dated Apr. 18, 2017 for European Application No. 15788858.7, 1 page.
Korean Office Action dated Feb. 19, 2018 for Korean Application No. 10-2016-7033906, 22 pages (with translation).
Korean Office Action dated Sep. 27, 2018 for Korean Application No. 10-2016-7033906, 19 pages (including English translation).

* cited by examiner

INTEGRATED PACKAGE CONTAINING MEMS ACOUSTIC SENSOR AND ENVIRONMENTAL SENSOR AND METHODOLOGY FOR FABRICATING SAME

PRIORITY CLAIM

Under 35 U.S.C. 120, this application is a Continuation Application and claims priority to U.S. application Ser. No. 14/273,845, filed May 9, 2014, entitled "INTEGRATED PACKAGE CONTAINING MEMS ACOUSTIC SENSOR AND ENVIRONMENTAL SENSOR AND METHODOLOGY FOR FABRICATING SAME," which is incorporated herein by reference.

TECHNICAL FIELD

Embodiments of the subject disclosure relate generally to acoustic and environmental sensors, and particularly to the integrated packaging of these sensors.

BACKGROUND

Integration of component devices of a consumer electronics product is desirable to reduce form factor. Integration often results in size reduction because multiple devices become parts of one integrated system. The integrated system itself can then be progressively reduced in size over time. Integration of multiple devices into one system is complex and made more complex in cases where each device is of a different type and has different manufacturing requirements.

For example, acoustic sensors (e.g. microphones) are utilized in applications with environmental sensors (e.g. humidity and/or temperature sensors). Presently, the humidity and/or temperature sensors, while being a part of the same product as the microphone, are packaged separately from the microphone. Stated differently, the types of sensors are located as discrete components within the same product. This leads to increased real estate cost in addition to complexity of manufacturing, as each component must be assembled separately on to the host circuit board of the product. A single package comprising a plurality of sensors would significantly simplify manufacturing, reduce costs, and reduce overall board area. Furthermore if the sensors can be integrated along with an application specific integrated circuit (ASIC) in the same package, further cost and size reductions can be realized.

However, efforts to integrate the foregoing sensors are hindered by several challenges. One such challenge is in bonding the microphone, a part of the acoustic sensor, to an application specific integrated circuit (ASIC). Temperatures used for such bonding are typically and approximately 430 degrees Celsius and higher. Environmental sensing materials, such as polymers, are not likely to survive at such temperatures. Another challenge occurs during release etching, a process utilized during manufacturing of the acoustic sensor, when the polymer experiences adverse effects rendering it defective in most if not all cases. Such shortcomings have prevented the integration of acoustic sensors with environmental sensors on the same IC substrate and/or package substrate.

It would be desirable to have an integrated package and methodology for making an integrated package that contains both acoustic and environmental sensors and also an ASIC for processing data generated by these sensors.

SUMMARY

An embodiment of the subject disclosure includes a packaged device that includes at least one environmental sensor, at least one acoustic sensor, and at least one port connecting the device to the environment, wherein the at least one environmental sensor measures characteristics of the environment and the at least one acoustic sensor measures sound waves. The port exposes the environmental sensor and the acoustic sensor to the environment. An example of an acoustic sensor is a microphone and an example of an environmental sensor is a humidity sensor.

A further understanding of the nature and the advantages of particular embodiments disclosed herein may be realized by reference of the remaining portions of the specification and the attached drawings.

DETAILED DESCRIPTION

In the described embodiments, integrated circuit (IC) substrate may refer to a silicon substrate with electrical circuits, typically CMOS circuits. Also, a CMOS IC substrate may include an ASIC. A cavity may refer to a recess in a substrate or a lid (cover). An enclosure may refer to a fully enclosed volume typically surrounding the MEMS structure and typically formed by the IC substrate, structural layer, MEMS substrate, and the standoff seal ring. A port may be an opening through a substrate to expose the MEMS structure to the surrounding environment. It is to be appreciated that an enclosure would include an acoustic port, in various embodiments of the subject disclosure.

In the described embodiments, a chip includes at least one substrate typically formed from a semiconductor material. A single chip may be formed from multiple substrates, where the substrates are mechanically bonded to preserve the functionality. Multiple chips include at least two substrates, wherein the two substrates are electrically connected, but do not require mechanical bonding. A package provides electrical connection between the bond pads on the chip to a metal pad that can be soldered to a printed circuit board (PCB). A package typically comprises a substrate and a cover. It is to be appreciated that the package hermetically seals its components, with the exception that the port opening of the package allows for air flow in and out of the package. Also, it is to be appreciated that the package provides an acoustic seal, with the exception that the port opening of the package allows for sound waves to enter and exit the package.

In the described embodiments, a cavity may refer to an opening or recession in a substrate wafer and enclosure may refer to a fully enclosed space that includes a port opening. In the described embodiments, back cavity may refer to a partial enclosed cavity equalized to ambient pressure via Pressure Equalization Channels (PEC). In various aspects of the subject disclosure, the back cavity provides acoustic sealing, with the exception that it allows sound waves to enter and exit by way of an acoustic MEMS sensor element (e.g. a diaphragm). In some embodiments, back cavity is also referred to as back chamber. A back cavity formed with in the CMOS-MEMS device can be referred to as integrated back cavity.

In the described embodiments, a rigid structure within an acoustic system that moves when subject to force may be referred to as a plate. A back plate may be a perforated plate used as an electrode to electrically sense the movable plate. In the described embodiments, perforations refer to acoustic openings for reducing air damping in moving plates. Acoustic port may be an opening for sensing the acoustic pressure. Acoustic barrier may be a structure that prevents acoustic pressure from reaching certain portions of the device. Linkage is a structure that provides compliant attachment to a substrate by way of an anchor.

Figure 1:
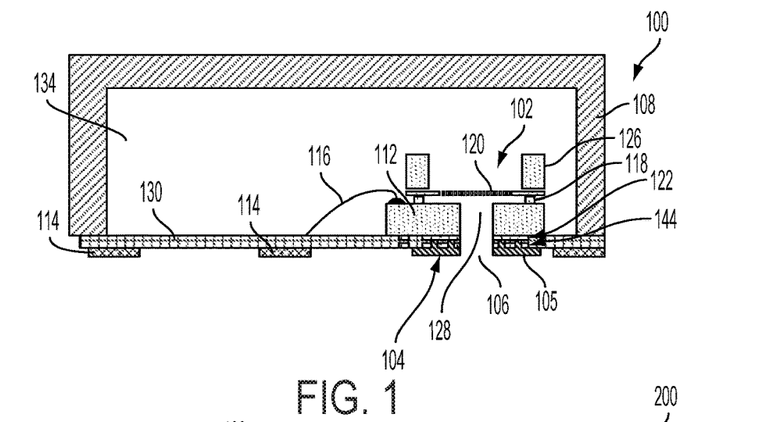
FIG. 1 illustrates an exemplary integrated package in which the acoustic sensor and the environmental sensor are aligned with the port.

Referring now to FIG. 1, a device 100 is shown, in accordance with an embodiment of the subject disclosure. The device 100 is shown to include an acoustic sensor 102, an environmental sensor 104, a port 106, a lid (or cover) 108, a package substrate 130, an integrated circuit (IC) substrate 112 and a back cavity 134. The acoustic sensor 102 is shown physically connected to the environmental sensor 104. Solder 114 connects device 100 to external substrates. The lid 108 and the package substrate 130 form a "package".

In the embodiment of FIG. 1, the port 106 is shown aligned with an acoustic sensor port 128, as will be shown and discussed herein, these ports need not be aligned. In addition, port 106 in package substrate 130 can receive acoustic waves for sensing by acoustic sensor 102, and, depending on the embodiment can receive other environmental phenomena. The acoustic sensor 102 includes a back cavity 134, sensor element 120 (e.g. a diaphragm), acoustic sensor substrate 126, acoustic sensor port 128, and IC substrate 112.

The acoustic sensor 102 is shown positioned above the IC substrate 112, in accordance with one of many other embodiments of the subject disclosure too numerous to list. Wire bond 116 electrically couples the IC substrate 112 to the package substrate 130. Through the physical connection between the IC substrate 112 and the acoustic sensor 102, the acoustic sensor 102 is also electrically coupled to the package substrate 130. The environmental sensor 104 is shown positioned below the package substrate 130 and IC substrate 112, which again is merely one embodiment of many others.

The environmental sensor 104 is shown to include sense electrodes 144, and an environmental sensing material 105 built directly on package substrate 130. The environmental sensor 104 is also shown to include a heater 122 and in some embodiments can also serve as a temperature sensor. The port 106 is shown formed in the package substrate 130 and the IC substrate 112. The port 106 is shown to extend through the environmental sensing material 105. In some embodiments, the environmental sensor 104 can be built to one side of the port eliminating the extension of the port 106 through the environmental sensing material 105.

In some embodiments, the acoustic sensor 102 is a microphone, such as, but not limited to, a MEMS microphone. In such embodiments, the sensor element 120 is a micromachined structure that moves in response to an acoustic signal. Each standoff 118 is a conductive path and separates the sensor element 120 from the IC substrate 112. The sensor element 120 and a conductive layer that is typically the top aluminum layer disposed on the IC substrate 112 collectively form a capacitor. The capacitance varies as the distance between the sensor element 120 and the IC substrate 112 varies due to the movement of the sensor element 120 caused by acoustic pressure vibrations. These vibrations are caused by sound waves entering the device 100 through the port 106.

The operation of the environmental sensor 104 may use capacitance variation, resistance variation, or mass loading to sense the particular environmental characteristic being sensed. Such characteristics, without limitation, are temperature, humidity, pressure, biological, and many more too numerous to list.

To this end, the IC substrate 112 plays a dual role in that it processes changes in two sensor elements, for example, sensor elements associated with acoustic sensor 102 and environmental sensor 104. The sensor element of the acoustic sensor 102 and the sensor element of the environmental sensor 104 may share the electronic processing capabilities of the IC substrate 112.

It is understood that dimensional terms, such as "top", "bottom", "side", and the like, as used herein, are relative and their use in describing various embodiments is merely for the sake of discussion and providing examples. It is understood that other dimensional relations may be employed and/or the same dimensional relation may be an opposite relation as that which is disclosed herein. For example, the acoustic sensor 102 may be flipped such that it is formed on top of the package substrate 130 and under the IC substrate 112. In fact, practically, and in accordance with alternative embodiments, the environmental sensor 104 may be formed on top of the acoustic sensor 102.

In an embodiment of the subject disclosure, the lid 108 is made of metal. In an embodiment of the subject disclosure, the package substrate 130 is made of a polymer, or ceramic. In an embodiment of the subject disclosure, the acoustic sensor 102 is a microphone or any other acoustic sensor with a port (or exposure). In yet another embodiment of the subject disclosure, the environmental sensor 104 is a gas, temperature, pressure, biological, nanoparticles, spores, pathogen, or chemical sensor, or any other suitable sensor that is suitable for exposure to environment by way of the port 106.

In some embodiments, the acoustic sensor 102 is a microphone, such as but not limited to, a MEMS microphone. In some embodiments, the integrated back cavity 134 is a part of the microphone, as well known to those in the field.

In some embodiments of the subject disclosure, the acoustic sensor 102 and the environmental sensor 104 are formed on a single substrate, such as the package substrate 130. In some embodiments of the subject disclosure, the acoustic sensor 102 and the environmental sensor 104 are formed on separate (or different) substrates. In some embodiments of the subject disclosure, the acoustic sensor 102 and the environmental sensor 104 are formed on a single IC substrate. In some embodiments of the subject disclosure, the acoustic sensor 102 and the environmental sensor 104 are formed on different package substrates.

While one acoustic sensor and one environmental sensor is shown and discussed herein, it is understood that more than one of each such sensors may be employed. The foregoing alternatives apply to the remaining embodiments of the subject disclosure as shown and discussed herein in addition to others not necessarily shown or discussed herein but contemplated.

It is understood that alternatives and variations of FIG. 1 apply to the remaining embodiments in addition to other contemplated embodiments unless expressly indicated otherwise.

Figure 2:
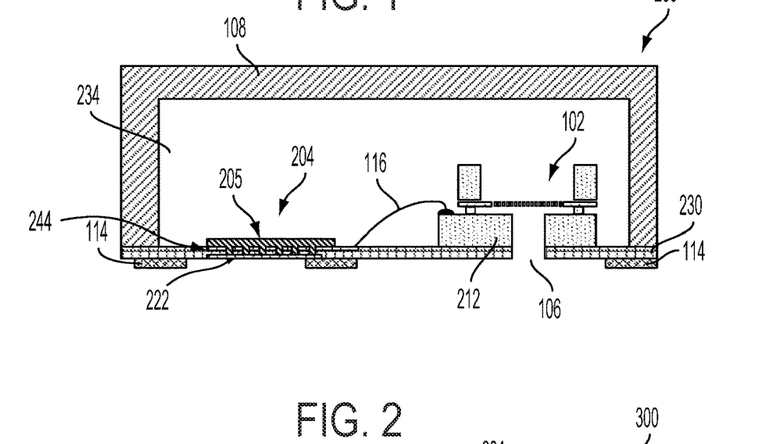
FIG. 2 illustrates an exemplary integrated package in which the environmental sensor is located in the back cavity of the acoustic sensor.

FIG. 2 shows a device 200, in accordance with another embodiment of the subject disclosure. The device 200 is analogous to the device 100 except for the following. The environment sensor 204 is disposed laterally with respect to IC substrate 212 and acoustic sensor 102, and is disposed within the acoustic sensor back cavity 234. Acoustic sensor 102 is shown positioned and coupled to the IC substrate 212 and IC substrate 212 is shown positioned on the package substrate 230. In fact, in the embodiment of FIG. 2, the environmental sensor 204 is shown to not be positioned on top of the port 106. The environmental sensor 204 is shown to include capacitor 244, environmental sensing material 205, and a heater 222, for which, in some embodiments can also serve as a temperature sensor. In addition, as with device 100 of FIG. 1, device 200 can comprise a wire bond 116 that electrically couples the IC substrate 212 to the package substrate 230 and solder 114 that connects device 200 to external substrates. The lid 108 and the package substrate 230 can form a "package".

Figure 3:
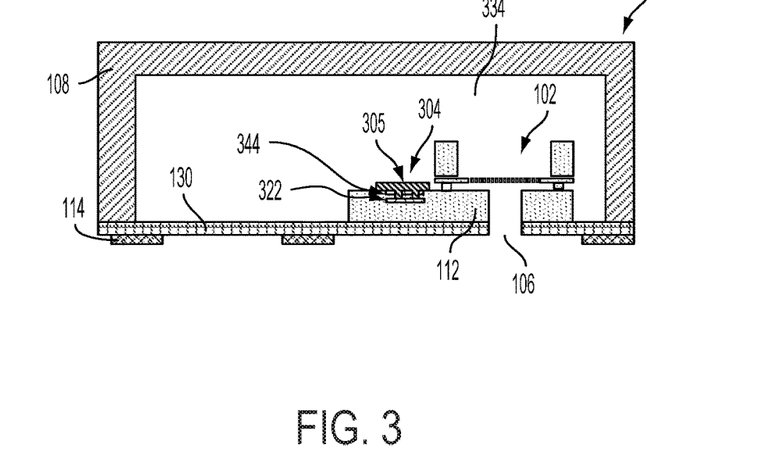
FIG. 3 illustrates an exemplary integrated package in which the acoustic sensor and the environmental sensor are located on top of and attached to an ASIC.

FIG. 3 shows a device 300, in accordance with another embodiment of the subject disclosure. In the embodiment of FIG. 3, the environmental sensor 304 is shown to include capacitor 344, environmental sensing material 305, and heater 322. The environmental sensor 304 is shown formed on top of the IC substrate 112, which as in the embodiment of FIG. 1, is shown disposed on the package substrate 130. No wire bonding of the environmental sensor 304 to the IC substrate 112 is necessary in the embodiment of FIG. 3 because the environmental sensor 304 is disposed and formed on top of the IC substrate 112. Accordingly, the environmental sensor 304 is physically and electrically coupled to the IC substrate 112 and formed on the package substrate 130. The acoustic sensor 102 is physically and electrically coupled to the IC 112. As opposed to remaining embodiments, the environmental sensor 304 and the acoustic sensor 102 of FIG. 3 are fully integrated onto one single IC substrate 112. As with device 100 of FIG. 1, device 300 is shown to include an acoustic sensor 102, an environmental sensor 304, a port 106, a lid (or cover) 108, a package substrate 130, an integrated circuit (IC) substrate 112, and a back cavity 334. In addition, device 300 can comprise solder 114 that connects device 300 to external substrates. The lid 108 and the package substrate 130 form a "package".

Figure 4:
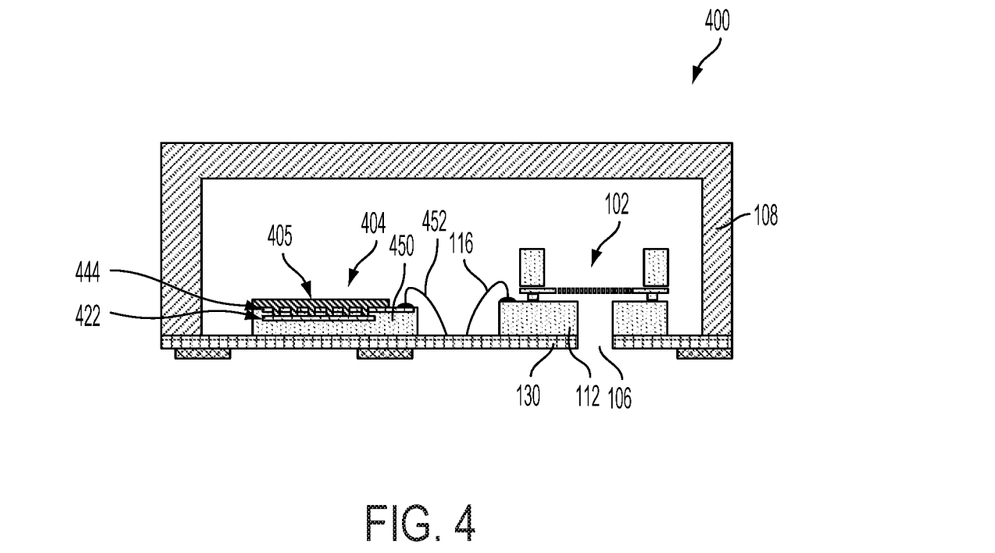
FIG. 4 illustrates an exemplary integrated package in which the acoustic sensor and the environmental sensor are attached to different ASICs.

FIG. 4 shows a device 400, in accordance with another embodiment of the subject disclosure. In the embodiment of FIG. 4, the environmental sensor 404 is shown to include the environmental sensing material 405, the capacitor 444, and the heater 422. The environmental sensor 404 is shown to be stand-alone and not a part of the IC substrate 112 in that it is formed on an environmental sensor substrate 450 that is disposed on top of the package substrate 130. The environmental sensor substrate 450 can comprise an IC substrate. Thus, the environmental sensor 404 is physically and electrically coupled to the environmental sensor substrate 450 comprising the IC substrate. In such case, the IC substrate 450 can also provide functionality for some part of, or all of, signal processing of environmental sensor's 404 data. Wire bond 452 electrically couples the environmental sensor 404 to the package substrate 130. IC substrate 112 is independently electrically coupled to the package substrate 130 through the wire bond 116. The acoustic sensor 102 is shown formed on top of the IC substrate 112, as in the embodiment of FIG. 1. As with device 100 of FIG. 1, device 400 is shown to include an acoustic sensor 102, an environmental sensor 404, a port 106, a lid (or cover) 108, a package substrate 130, an integrated circuit (IC) substrate 112, and a back cavity. In addition, device 400 can comprise solder that connects device 400 to external substrates. The lid 108 and the package substrate 130 form a "package".

Figure 5:
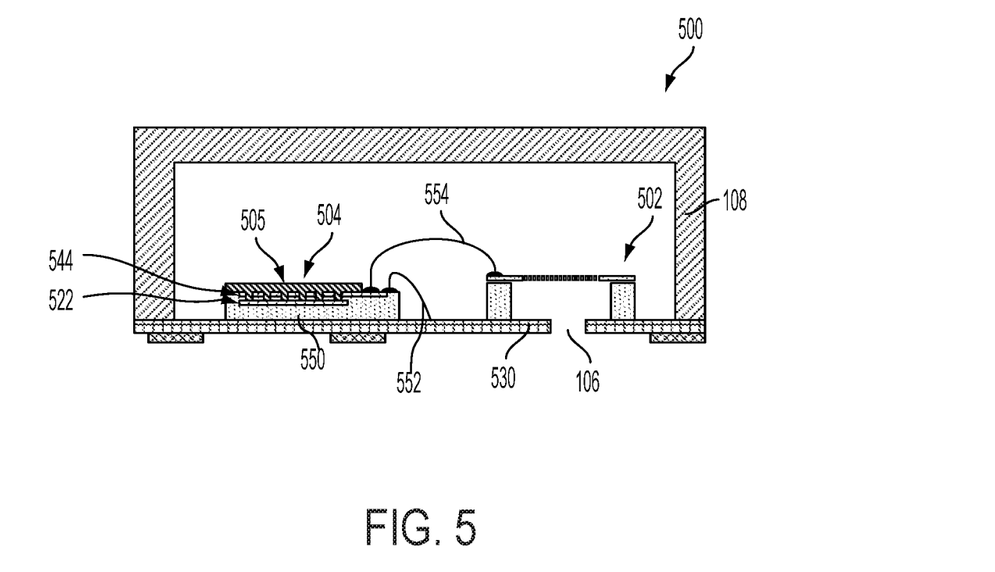
FIG. 5 illustrates an exemplary integrated package in which the microphone is wire bonded to an ASIC.

FIG. 5 shows a device 500, in accordance with another embodiment of the subject disclosure. The device 500 is analogous to the device 400 except that in FIG. 4 the acoustic sensor is connected to and formed on top of the IC substrate 112, whereas the acoustic sensor 502 is not formed on top of the IC substrate. That is, environmental sensor substrate 550 comprising an IC substrate can include functionality configured to process both data generated by the environmental sensor 504 as well as data generated by the acoustic sensor 502. The environmental sensor 504 is shown to include the capacitor 544, the heater 522 and the environmental sensing material 505. The environmental sensor 504 is shown disposed and formed on top of the environmental sensor substrate 550 comprising an IC substrate. Thus, the environmental sensor 504 is physically and electrically coupled to the environmental sensor substrate 550 comprising an IC substrate. The environmental sensor substrate 550 comprising an IC substrate is shown formed on top of the package substrate 530 and is electrically coupled to it through the wire bond 552. The acoustic sensor 502 is shown disposed on top of the package substrate 530 and is electrically coupled to the environmental sensor substrate 550 comprising an IC substrate through the wire bond 554. As with device 400 of FIG. 4, device 500 is shown to include an acoustic sensor 502, an environmental sensor 504, a port 106, a lid (or cover) 108, a package substrate 530, and a back cavity. In addition, device 500 can comprise solder that connects device 500 to external substrates. The lid 108 and the package substrate 530 form a "package".

Figure 6:
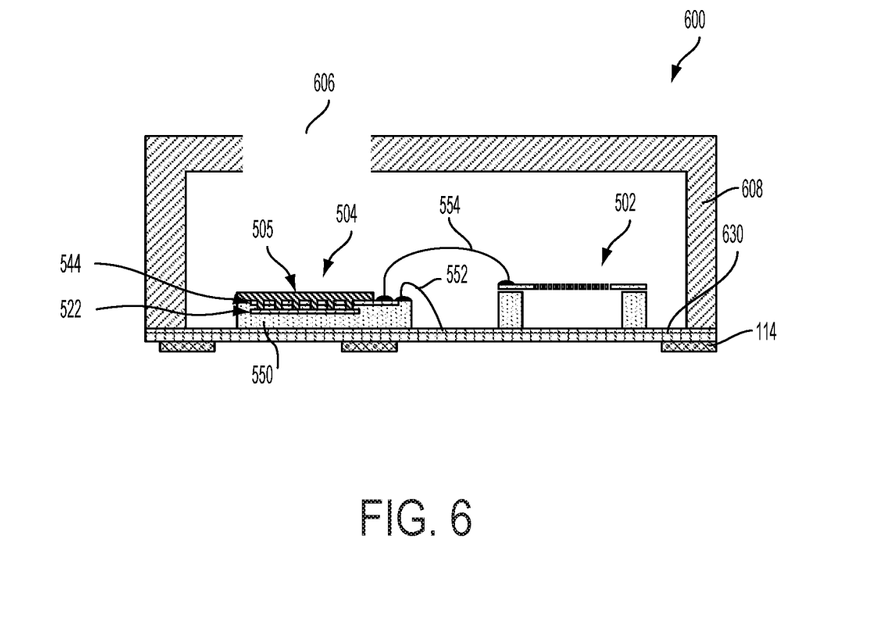
FIG. 6 illustrates an exemplary integrated package in which the port is located in the cover (or lid) of the package.

FIG. 6 shows a device 600, in accordance with yet another embodiment of the subject disclosure. The device 600 is analogous to the device 500 except that the package substrate 630 has no port at the place where the environmental sensor 504 and the acoustic sensor 502 are positioned. Rather, it has a port 606 in the lid 608, at a place that is substantially on top of the environmental sensor 504 and horizontally displaced from and positioned on top of the acoustic sensor 502. As with device 500 of FIG. 5, device 600 is shown to include an acoustic sensor 502, an environmental sensor 504, a port 606, a lid (or cover) 608, a package substrate 630, and a back cavity. The environmental sensor 504 is shown to include the capacitor 544, the heater 522, and the environmental sensing material 505. The environmental sensor substrate 550 comprising an IC substrate is shown formed on top of the package substrate 630 and is electrically coupled to it through the wire bond 552. The acoustic sensor 502 is shown disposed on top of the package substrate 630 and is electrically coupled to the environmental sensor substrate 550 comprising an IC substrate through the wire bond 554. In addition, device 600 can comprise solder 114 that connects device 600 to external substrates. The lid 608 and the package substrate 630 form a "package".

Figure 7:
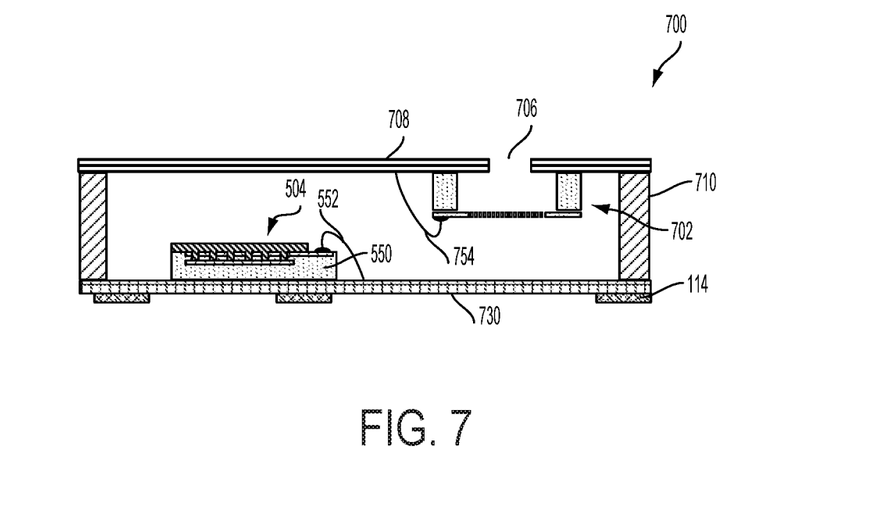
FIG. 7 illustrates an exemplary integrated package in which the microphone is attached to the cover and is aligned with the port that is located in the cover of the package.

FIG. 7 shows a device 700, in accordance with another embodiment of the subject disclosure. The embodiment of FIG. 7 is analogous to that of FIG. 6 except that the acoustic sensor 702 is shown at a position opposite to that of the environmental sensor 504. More specifically, the acoustic sensor 702 is shown to be disposed on the inner side of a lid 708 comprising a substrate for acoustic sensor 702, and the environmental sensor 504 is shown disposed on the package substrate 730, similar to the position of the environmental sensor 504 of the device 600. A port 706 is shown through the top portion of the lid 708 and extending through the acoustic sensor 702. The acoustic sensor 702 is electrically coupled through wire bond 754 to lid 708 instead. FIG. 7 depicts an entire package comprising substantially the same materials like that of printed circuit boards, where three packaging layers, e.g., package substrate 730, wall enclosure layer 710, and lid 708 comprising a substrate for acoustic sensor 702, are used. Accordingly, package substrate 730 supports wall enclosure layer 710, which defines the package enclosure height, and lid 708 is then assembled onto the wall enclosure layer to complete the enclosure that represents the back volume of the acoustic sensor 702. As with device 600 of FIG. 6, the environmental sensor substrate 550 comprising an IC substrate is shown formed on top of the package substrate 730 and is electrically coupled to it through the wire bond 552. In addition, device 700 can comprise solder 114 that connects device 700 to external substrates. The lid 708 and the package substrate 730 form a "package".

Figure 8:
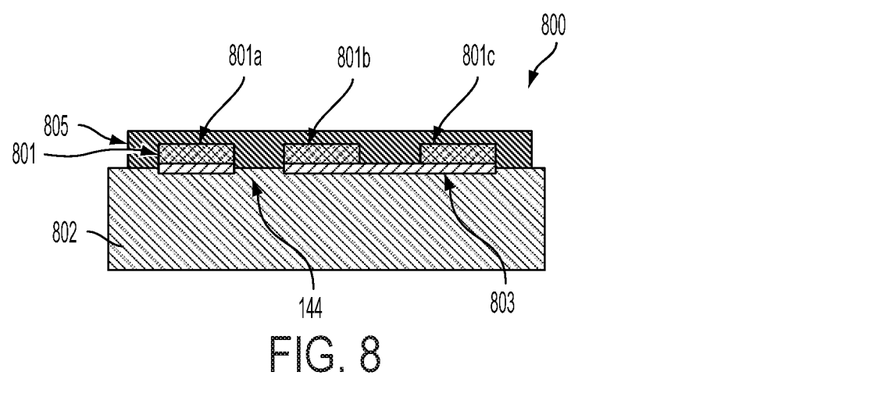
FIG. 8 illustrates an exemplary environmental sensor.

FIG. 8 shows a part of the environmental sensor 800, in accordance with an embodiment of the subject disclosure. The environmental sensor 800 is shown to have a laminate substrate 802, metal lines 801 (e.g., metal lines 801a, 801b, and 801c), sense capacitor 144 comprising metal electrodes 801a and 801b, and environmental sensing material 805. The sense capacitor 144 provides a variable capacitance between metal electrodes 801a and 801b in response to a change in a particular environmental characteristic associated with and experienced by environmental sensing material 805. The laminate substrate 802 can be the substrate 130 or substrate 230 of FIGS. 1 and 2, respectively, upon which the environmental sensors 104 or 204 may be formed. In the embodiment of FIG. 8, a metal or semiconducting layer 803, comprising a layer of material that has a relatively higher resistance than metal layer 801 and formed on laminate substrate 802, can form a heating element and/or resistance-based temperature sensor by being connected between metal lines 801b and 801c formed on layer 803.

Figure 9:
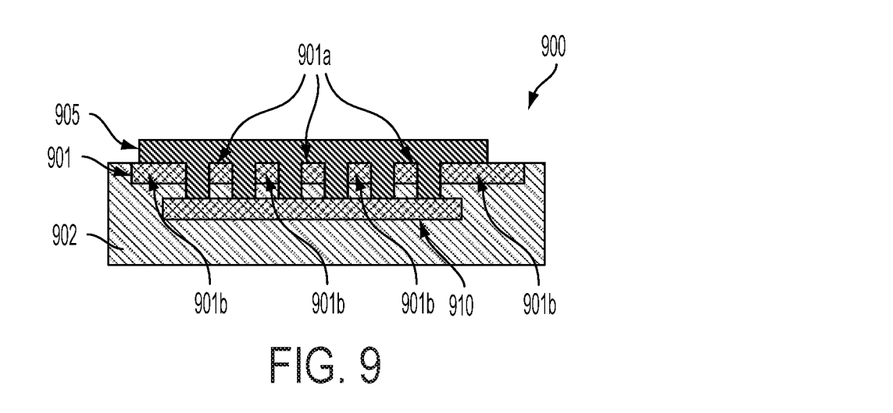
FIG. 9 illustrates another exemplary environmental sensor.

FIG. 9 shows a part of the environmental sensor 900, in accordance with an embodiment of the subject disclosure. The sensor 900 is analogous to the sensor 800 except that environmental sensor 900 has two metal layers, metal layer 901 and metal layer 910, which are separated by material of laminate substrate 902, and thus, are not in direct physical contact. Sense capacitance can be measured across interdigitated electrodes 901a and 901b formed in single layer metal 901. Environmental sensing material 905 is shown formed on top of metal layer 901 and between the interdigitated electrodes 901a and 901b formed by metal layer 901. Metal layer 910 can be used as a heater element as well as temperature sensor.

It is also possible to transform the heating element into a temperature sensor if the metal resistance versus temperature behavior is well-characterized. In a typical laminate process, all exposed parts of the metal layer will be plated with gold finishing. The potential corrosion due to humid environmental sensing material no longer exists.

Accordingly, with the right choice of humidity-sensitive material, it is possible to fully integrate humidity sensor right on top of the IC substrate where it could sustain high temperature during semiconductor processing (<450° C.) and some release processing (such as vapor HF release etch.). Thus, such a fully-integrated embodiment, an example of which is shown in FIG. 3, is attractive, considering the smallest form factor and lowest manufacturing cost achievable.

Figure 10:
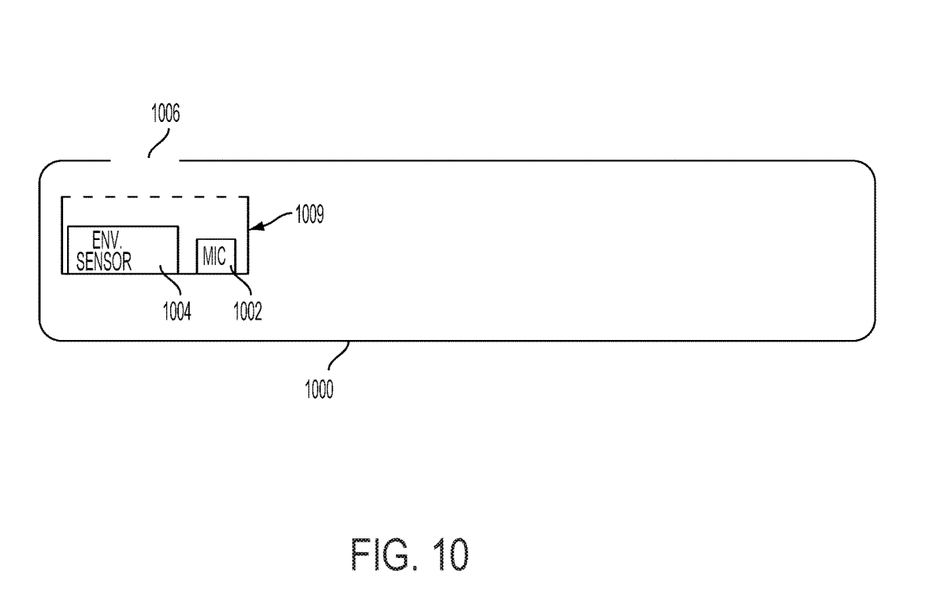
FIG. 10 illustrates an exemplary application of an integrated package including an acoustic sensor and an environmental sensor.

FIG. 10 shows an exemplary application of the various embodiments of the subject disclosure. More specifically, a host system 1000 is shown to include a port 1006, an environmental sensor 1004 and an acoustic sensor 1002, collectively defining a hybrid device 1009. The hybrid device 1009 has its own port that may or may not be aligned with the port 1006.

Examples of the acoustic sensor 1002 are the acoustic sensors of FIGS. 1-7; similarly, examples of the environmental sensor 1004 are the environmental sensors of FIGS. 1-7. The host system 1000 may be any system requiring acoustic and environmental sensors, such as a smartphone, a smart watch or a wearable exercise device. Other applications of the hybrid device 1009 are contemplated and too numerous to list here.

Although the description has been provided with respect to particular embodiments thereof, these particular embodiments are merely illustrative and not restrictive.

As used herein, the term "top", "bottom", "left", and "right" are relative and merely examples of the structures disclosed. It is understood that the relation of the structures may be opposite to that which is stated. For example, the term "bottom", as used herein, may be "top" in other embodiments of the subject disclosure.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What is claimed is:

1. A microelectromechanical systems (MEMS) device package comprising:
  a package comprising a package substrate and a lid;
  an environmental sensor comprising a gas sensor with a heating element configured to sense a composition parameter of a gas, wherein the composition parameter of the gas is associated with at least one of a chemical parameter, a biological parameter, a nanoparticle parameter, a spore parameter, or a pathogen parameter of the gas, and wherein the environmental sensor is disposed on the package substrate;
  a MEMS acoustic sensing element comprising a diaphragm and disposed in the package;

an integrated circuit (IC) disposed in the package and configured to process data generated by the MEMS acoustic sensing element and the environmental sensor; and a port disposed in the package configured to receive acoustic waves for the MEMS acoustic sensing element and air for the environmental sensor, wherein the package includes an acoustically sealed back cavity that encompasses the MEMS acoustic sensing element and the IC.

2. The MEMS device package of claim 1, wherein the MEMS acoustic sensing element is disposed on the IC.

3. The MEMS device package of claim 1, wherein the MEMS acoustic sensing element is disposed on the package substrate.

4. The MEMS device package of claim 1, wherein the IC comprising the environmental sensor is disposed on the package substrate.

5. The MEMS device package of claim 1, wherein the gas sensor comprises an environmental sensing material in a configuration sensitive to a change in the composition parameter.

6. The MEMS device package of claim 5, wherein the environmental sensing material is configured in a plurality of segments interspersed between and in direct contact with a plurality of metal electrodes.

7. The MEMS device package of claim 6, wherein the plurality of metal electrodes are arranged such that a variable electrical characteristic results from a change in the composition parameter at the environmental sensing material.

8. The MEMS device package of claim 6, wherein at least one of the plurality of metal electrodes comprises the heating element of the gas sensor.

9. A method for fabricating a microelectromechanical systems (MEMS) device package comprising:
   forming a package substrate;
   forming a MEMS acoustic sensor element comprising a diaphragm in the MEMS device package;
   forming, in the MEMS device package, a gas sensor comprising a heating element and an environmental sensing material in a configuration sensitive to a change in an environmental characteristic associated with a gas composition parameter of a gas at the environmental sensing material, wherein the composition parameter of the gas is associated with at least one of a chemical parameter, a biological parameter, a nanoparticle parameter, a spore parameter, or a pathogen parameter of the gas, and wherein the forming the gas sensor includes depositing a plurality of segments of the environmental sensing material interspersed between a plurality of metal electrodes in direct contact with the environmental sensing material;
   forming electrical connections between an application specific integrated circuit (ASIC) disposed in the MEMS device package and the MEMS acoustic sensor element and between the ASIC and the gas sensor;
   forming a cover attached to the package substrate to encompass the MEMS acoustic sensor element, the ASIC, and the gas sensor; and
   forming an opening in the MEMS device package, wherein the opening is configured to receive sound waves and the gas.

10. The method of claim 9, wherein the forming the gas sensor comprises fabricating a gas sensor arrangement that enables providing a variable electrical characteristic in response to the change in the environmental characteristic at the environmental sensing material.

11. The method of claim 9, wherein the forming the gas sensor comprises configuring at least one of the plurality of metal electrodes as the heating element of the gas sensor.

12. The method of claim 9, further comprising:
   forming the MEMS acoustic sensor element on the ASIC.

13. The method of claim 12, wherein the forming the gas sensor comprises at least one of forming the gas sensor on the ASIC or forming the gas sensor on the package substrate adjacent to the ASIC.

14. A microelectromechanical systems (MEMS) device package, comprising:
   a package comprising a package substrate and a lid;
   a gas sensor comprising a heating element, wherein the gas sensor is disposed on the package substrate and configured to sense a composition parameter of a gas comprising at least one of a chemical parameter, a biological parameter, a nanoparticle parameter, a spore parameter, or a pathogen parameter of the gas;
   a MEMS acoustic sensing element comprising a diaphragm and disposed in the package; and
   an integrated circuit (IC) disposed in the package and configured to process data generated by the MEMS acoustic sensing element and the gas sensor;
   a port disposed in the package configured to receive acoustic waves for the MEMS acoustic sensing element and air for the gas sensor, wherein the package includes an acoustically sealed back cavity that encompasses the MEMS acoustic sensing element and the IC.

15. The MEMS device package of claim 14, wherein the MEMS acoustic sensing element is disposed on the IC, or wherein the IC comprising the gas sensor is disposed on the package substrate.

16. The MEMS device package of claim 14, wherein the gas sensor comprises an environmental sensing material in a configuration sensitive to a change in the composition parameter, wherein the environmental sensing material is configured in a plurality of segments interspersed between and in direct contact with a plurality of metal electrodes, and wherein the plurality of metal electrodes are arranged such that a variable electrical characteristic results from a change in the composition parameter at the environmental sensing material.

17. The MEMS device package of claim 16, wherein at least one of the plurality of metal electrodes comprises the heating element of the gas sensor.

* * * * *